(12) United States Patent
Marsh

(10) Patent No.: US 6,403,499 B2
(45) Date of Patent: *Jun. 11, 2002

(54) PLANARIZATION OF NON-PLANAR SURFACES IN DEVICE FABRICATION

(75) Inventor: Eugene P. Marsh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/790,405

(22) Filed: Feb. 21, 2001

Related U.S. Application Data

(63) Continuation of application No. 09/177,019, filed on Oct. 22, 1998, now Pat. No. 6,218,316.

(51) Int. Cl.$^7$ ................................................ H01L 21/31
(52) U.S. Cl. ..................... 438/780; 427/370; 430/270.1; 528/37
(58) Field of Search ................................ 438/760, 780; 427/370; 430/270.1; 528/37

(56) References Cited

U.S. PATENT DOCUMENTS

| | | | |
|---|---|---|---|
| 1,777,310 A | 10/1930 | Hopkinson | 425/384 |
| 2,373,770 A | 4/1945 | Martin | 100/269.04 |
| 2,431,943 A | 12/1947 | Land et al. | |
| 3,120,205 A | 2/1964 | Pfeiffer et al. | 72/63 |
| 3,135,998 A | 6/1964 | Fowler et al. | 425/398 |
| 3,850,559 A | 11/1974 | Mintz et al. | 425/144 |
| 4,234,373 A | 11/1980 | Reavill et al. | 156/382 |
| 4,476,780 A | 10/1984 | Bunch | 100/214 |
| 4,700,474 A | 10/1987 | Choinski | 29/846 |
| 4,734,155 A | 3/1988 | Tsunoda et al. | 156/583.1 |
| 4,806,195 A | 2/1989 | Namysi | 156/382 |
| 4,810,672 A | 3/1989 | Schwarzbauer | 228/123.1 |
| 5,039,595 A | * 8/1991 | Schwalm et al. | 430/326 |

(List continued on next page.)

FOREIGN PATENT DOCUMENTS

| | | |
|---|---|---|
| EP | 0 285 245 | 10/1988 |
| EP | 683 511 A2 | 11/1995 |
| EP | 683 511 A3 | 11/1995 |
| EP | 0 731 503 | 9/1996 |
| GB | 998210 | 7/1965 |
| WO | 90/12683 | 11/1990 |

OTHER PUBLICATIONS

H. Yoshino et al., Photoacid Structure Effects on Environmental Stability of 193 nm Chemically Amplified Positive Resists. IEEE, pp. 76–77.*

(List continued on next page.)

Primary Examiner—Phat X. Cao
Assistant Examiner—Anh Duy Mai
(74) Attorney, Agent, or Firm—TraskBritt

(57) ABSTRACT

A method of planarizing a surface of a wafer includes providing a planarization material on the wafer surface and bringing a substantially flat surface into contact with the planarization material on the wafer. The planarization material is exposed to radiation at a first wavelength to cure the planarization material and is exposed to radiation at a second wavelength to cause changes to the planarization material that facilitate separation of the substantially flat surface from the planarization material.

24 Claims, 8 Drawing Sheets

U.S. PATENT DOCUMENTS

| | | | |
|---|---|---|---|
| 5,049,232 A | 9/1991 | Tola | 216/20 |
| 5,078,820 A | 1/1992 | Hamamura et al. | 156/267 |
| 5,122,848 A | 6/1992 | Lee et al. | 257/265 |
| 5,124,780 A | 6/1992 | Sandhu et al. | 257/344 |
| 5,205,770 A | 4/1993 | Lowrey et al. | 445/24 |
| 5,232,875 A | 8/1993 | Tuttle et al. | 438/693 |
| 5,238,862 A | 8/1993 | Blalock et al. | 438/398 |
| 5,250,450 A | 10/1993 | Lee et al. | 438/270 |
| 5,261,997 A | 11/1993 | Inselmann | 156/556 |
| 5,286,329 A | 2/1994 | Iiiima et al. | 156/297 |
| 5,300,155 A | 4/1994 | Sandhu et al. | 148/33 |
| 5,300,801 A | 4/1994 | Blalock et al. | 257/309 |
| 5,302,233 A | 4/1994 | Kim et al. | 438/692 |
| 5,302,343 A | 4/1994 | Jacob | 422/23 |
| 5,312,512 A | 5/1994 | Allman et al. | 438/624 |
| 5,314,843 A | 5/1994 | Yu et al. | 438/692 |
| 5,328,973 A * | 7/1994 | Roeschert et al. | 526/262 |
| 5,331,018 A * | 7/1994 | McGinniss et al. | 522/16 |
| 5,434,107 A | 7/1995 | Paranjpe | 438/760 |
| 5,492,858 A | 2/1996 | Bose et al. | 438/437 |
| 5,516,729 A | 5/1996 | Dawson et al. | 438/623 |
| 5,533,924 A | 7/1996 | Stroupe et al. | 451/286 |
| 5,554,065 A | 9/1996 | Clover | 451/283 |
| 5,558,015 A | 9/1996 | Miyashita et al. | 100/50 |
| 5,569,062 A | 10/1996 | Karlsrud | 451/285 |
| 5,575,707 A | 11/1996 | Talieh et al. | 451/173 |
| 5,618,381 A | 4/1997 | Doan et al. | 438/633 |
| 5,624,299 A | 4/1997 | Shendon | 451/28 |
| 5,624,300 A | 4/1997 | Kishii et al. | 451/36 |
| 5,624,303 A | 4/1997 | Robinson | 451/285 |
| 5,624,304 A | 4/1997 | Pasch et al. | 451/287 |
| 5,629,242 A | 5/1997 | Nagashima et al. | 438/692 |
| 5,639,697 A | 6/1997 | Weling et al. | 438/633 |
| 5,643,046 A | 7/1997 | Katakabe et al. | 451/6 |
| 5,643,050 A | 7/1997 | Chen | 451/10 |
| 5,643,406 A | 7/1997 | Shimomura et al. | 438/693 |
| 5,643,837 A | 7/1997 | Hayashi | 438/693 |
| 5,650,261 A | 7/1997 | Winkle | 430/270.1 |
| 5,679,610 A | 10/1997 | Matsuda et al. | 438/584 |
| 5,691,100 A | 11/1997 | Kudo et al. | 430/170 |
| 5,700,890 A | 12/1997 | Chou | 526/272 |
| 5,736,424 A | 4/1998 | Prybyla et al. | 438/780 |
| 5,846,690 A * | 12/1998 | Padmanaban et al. | 430/284.1 |
| 5,967,030 A | 10/1999 | Blalock | 100/211 |
| 6,062,133 A | 5/2000 | Blalock | 100/211 |
| 6,316,363 B1 * | 11/2001 | Blalock et al. | 438/691 |
| 6,331,488 B1 * | 12/2001 | Doan et al. | 438/698 |

OTHER PUBLICATIONS

H. Guckel et al., Deep X–Ray and UV Lithographies for Micromechanics. 1990 IEEE, pp. 118–122.*

L.A. Pederson Sr. et al., Charaterization of a Photoresist with Wavelength Selected Tone. 1990 IEEE, pp. 1828–1835.*

J.E. Bousaba et al., Plasma Resistant Modified I–Line, Deep UV, and E–Beam Resists. 1995 IEEE, pp. 195–200.*

L. K. White, Planarization Properties of Resist and Polyimide Coatings. Journal of the Electrochemical Society: Solid–State Science and Technology, Jul. 1983, pp. 1543–1548.*

L. B. Rothman, Properties of Thin Polyimide Films. Journal of the Electrochemical Society: Solid–State Science and Technology, vol. 127, No. 10, Oct. 1980, pp. 2216–2220.*

J. M. Moran et al., High Resolution, Steep Profil Resist Patterns. J. Vac. Sci. Technol., vol. 16(6), Nov./Dec. 1979, pp. 1620–1624.*

Exhibit A, 2 pages.

Cameron et al., "Photogeneration of Organic Bases from o–Nitrobenzyl–Derived Carbamates", J. Am. Chem. Society, 1991, 113, pp. 4304–4313.

Cameron et al., "Base Catalysis in Imaging Materials", J. Org. Chem., 1990, 55, pp. 5919–5922.

Allen et al., "Photoresists for 193–nm Lithography", IBM J. Res. Develop., vol. 41, No. 1/2, Jan.–Mar. 1997, pp. 95–104.

Seeger et al., "Thin–film Imaging: Past, Present, Prognosis", IBM J. Res. Develop., vol. 41, No. 1/2, Jan.–Mar. 1997, pp. 105–118.

Shaw et al., "Negative Photoresists for Optical Lithography", IBM J. Res. Develop., vol. 41, No. 1/2, Jan.–Mar. 1997, pp. 81–94.

Ito, "Chemical Amplification Resists: History and Development Within IBM", IBM J. Res. Develop., vol. 41, No. 1/2, Jan.–Mar. 1997, pp. 69–80.

Rothschild et al., "Lithography at a Wavelength of 193 nm", IBM J. Res. Develop., vol. 41, No. 1/2, Jan.–Mar. 1997, pp. 49–55.

* cited by examiner

PLANARIZATION OF NON-PLANAR SURFACES IN DEVICE FABRICATION

CROSS-REFERENCE TO RELATED APPLICATION

This application is a continuation of application Ser. No. 09/177,019, filed Oct. 22, 1998, now U.S. Pat. No. 6,218,316 B1, issued Apr. 17, 2001.

BACKGROUND OF THE INVENTION

The present invention relates generally to device processing and, in particular, to the planarization of non-planar surfaces in the fabrication of semiconductor or other devices.

The fabrication of electronic devices, such as semiconductor devices, typically produces surfaces that are non-planar. In some fabrication techniques, for example, multiple layers are formed sequentially on a silicon or other substrate. The layers can be processed into a desired pattern by the selective deposition of one or more materials or by removing selected regions of one or more layers. As more layers are formed, the topography or irregularity of the surface tends to increase.

An irregular surface can present various difficulties during device fabrication. For example, lithographic processes are often used to provide the patterning for the layers. During a typical lithographic process, a photosensitive material is deposited on a layer, exposed to radiation in a desired pattern, and developed to reveal the exposed pattern. To produce a photolithographic pattern with high resolution, the exposure light is focused at a specific depth, and the focus is maintained over a range of depths that is at least about two times the width of the pattern features. However, if the deposited resist material is not planar, the exposed image will not be in focus across the entire semiconductor wafer and throughout the film thickness. The likelihood of degraded lithographic results increases. Moreover, surface irregularities adversely affect metallization and other interconnections because the metal deposited over the surface has bends and turns which conform to the surface irregularities. Such bends and turns can cause undesirable current crowding.

To reduce the effects of surface irregularities, techniques are used to planarize the surface of the device on which the photosensitive material is deposited. Such techniques include, for example, etch-back techniques as well as chemical-mechanical polishing (CMP) techniques.

Recently, a technique has been proposed in which an object with a flat surface is pressed into contact with a planarization material, such as a photoresist or resin, and deposited on the wafer. The planarization material is cured while in contact with the flat surface, and the flat surface is separated from the planarization material. The planar surface then can be transferred from the planarization material to the underlying layers.

One difficulty encountered with the foregoing technique is that, when the flat surface is separated from the planarization material, the planarization material can adhere to the flat surface, resulting in a surface that is less planar than desired. Accordingly, it would be advantageous to have a technique for planarizing a substrate in a manner that reduces or prevents adhesion of the planarization material to the flat surface.

BRIEF SUMMARY OF THE INVENTION

In general, according to one aspect, a method of planarizing a surface of a wafer includes providing a planarization material on the wafer surface and bringing a substantially flat surface into contact with the planarization material on the wafer. The planarization material is exposed to radiation at a first wavelength to cure the planarization material and is exposed to radiation at a second wavelength to cause changes to the planarization material that facilitate separation of the flat surface from the planarization material.

The flat surface can be provided, for example, by using an optical flat that is transparent to the radiation at the first and second wavelengths. The radiation at the first and second wavelengths can be transmitted through the optical flat and subsequently absorbed by the planarization material. The planarization material can include, for example, a resist or resin.

In various implementations, one or more of the following features are present. In one embodiment, curing of the planarization material is inhibited at or near the interface with the flat surface to facilitate separation of the planarization material and the flat surface. The planarization material can include an agent which is sensitive to the radiation at the second wavelength and which inhibits curing of the planarization material when exposed to the radiation at the second wavelength. Preferably, the radiation at the second wavelength is absorbed substantially by the planarization material at or near the interface between the planarization material and the flat surface. In one particular implementation, the planarization material includes an acid-generating agent which is sensitive to radiation at the first wavelength and a base-generating agent which is sensitive to radiation at the second wavelength. The base generated at or near the interface when the planarization material is exposed to radiation at the second wavelength can be used to neutralize acid produced when the planarization material is exposed to radiation at the first wavelength.

In a second embodiment, the planarization material can produce a gaseous by-product when exposed to radiation at the second wavelength. The gaseous by-product can produce localized pressure at the interface between the planarization material and the flat surface. The localized pressure can facilitate separation of the planarization material from the flat surface. In one particular implementation, the planarization material includes a carbonate which generates a gas such as carbon dioxide when exposed to deep ultraviolet radiation.

In a third embodiment, the planarization material can include an agent which is sensitive to the radiation at the second wavelength and which causes the planarization material to decompose when exposed to the radiation at the second wavelength. Preferably, the radiation at the second wave-length is absorbed substantially by the planarization material at or near the interface between the planarization material and the flat surface. For example, in one particular implementation, the planarization material can include a polymer with a doubly substituted carbon backbone and the second wavelength can be in the deep UV range.

The foregoing techniques can be combined to facilitate further separation of the planarization material from the optical flat.

In general, improved planarization is possible by using the techniques described herein. Higher degrees of planarization are made possible even for devices with severe topography.

Other features and advantages will be readily apparent from the following detailed description, the accompanying drawings and the claims.

DETAILED DESCRIPTION OF THE INVENTION

As described in greater detail below, an object with a substantially flat surface, such as an optical flat, is used to planarize a surface of a semiconductor or other device during the device fabrication process. The techniques described below relate to reducing or eliminating adhesion of a planarization material, such as a resin, to the optical flat.

In general, the planarization material includes a first optically sensitive agent which allows the planarization material to be cured or hardened by exposing it to a source of radiation at a first wavelength. The planarization material also includes a second agent which, when exposed to a source of radiation at a second wavelength, affects the properties of the planarization material to reduce or prevent adhesion to the flat surface of the object. The second wavelength can be chosen so that layers of the planarization material at or near the interface with the flat surface of the object are affected selectively, while the properties of the remaining planarization material remain substantially unaffected by the radiation at the second wavelength.

Figure 1:
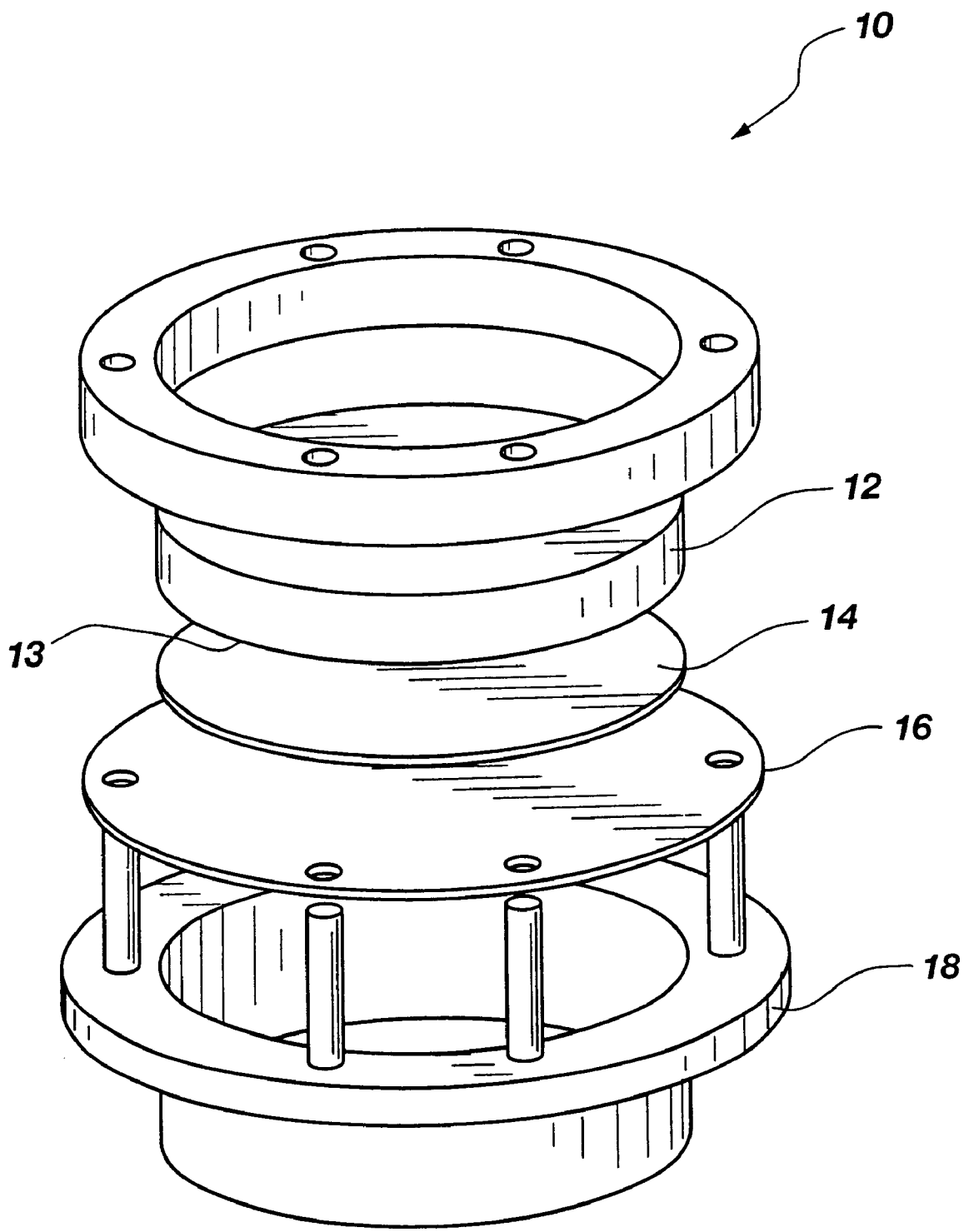
FIG. 1 illustrates an exemplary assembly for use in planarizing a surface of a semiconductor device.

FIG. 1 illustrates an exemplary assembly 10 which includes an optical flat 12 having a lower surface 13 which can be brought into contact with a surface of a semiconductor or other wafer 14 to be planarized. The surface 13 should be sufficiently flat to planarize the wafer to at least sixty percent and, preferably, to at least eight-five percent. The optical flat 12 can be, for example, a fused silica disc that is transparent to the first and second wavelengths. Alternatively, the optical flat can be made of quartz or sapphire.

Figure 2:
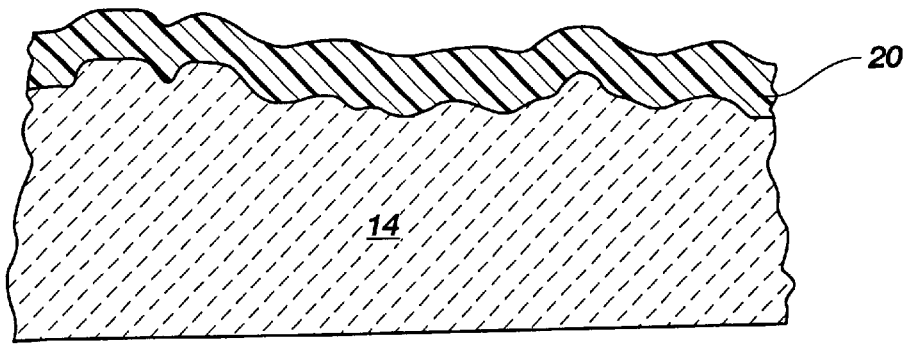
FIGS. 2–4 illustrate generally the planarization process according to the invention.
Figure 3:
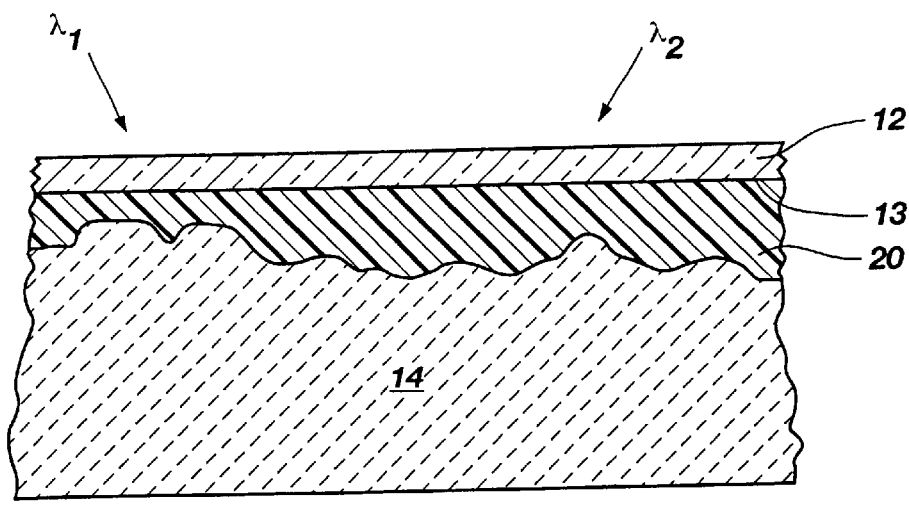
Figure 4:
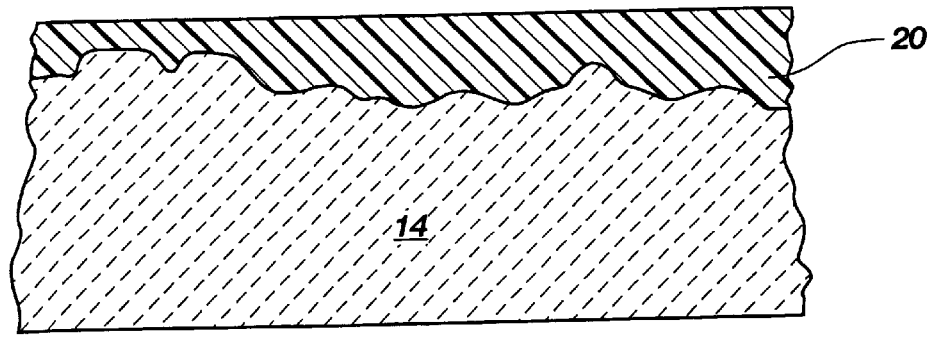

Initially, a planarization material 20 is applied in a flowable state to the top surface of the wafer 14 (FIG. 2). The wafer 14 can include one or more semiconductor layers or structures and can include active or operable portions of semiconductor devices. Additional layers of other materials also may be present. The wafer 14 is placed on a flexible mat 16 above a pressurizing chamber 18 with the surface of the wafer that is to be planarized facing upward. The chamber 18 is pressurized to press the planarization material 20 on the wafer 14 into contact with the optical flat 12 so as to transfer the flatness of the optical flat to the planarization material (FIG. 3). In some implementations, prior to moving the optical flat 12 into contact with the planarization material 20, the planarization material is soft cured at an elevated temperature to remove solvent. Once the optical flat 12 is in contact with the planarization material, the planarization material is exposed to radiation of at least two different wavelengths or wavelength ranges. One wavelength $\lambda_2$ is selected to cure or harden the planarization material, and the second wavelength $\lambda_2$ is chosen to affect properties of the planarization material so as to facilitate separation of the lower surface 13 from the planarization material. The optical flat 12 then is separated from the planarization material, leaving a planarized surface on the wafer (FIG. 4). The planarity of the planarization material can be transferred to the underlying layer(s) on the wafer 14 using known techniques, for example, by etching the planarization material 20 and a portion of the underlying layer(s).

Various planarization materials that are solidified by curing include an acid-generating additive that generates acid when heated or irradiated. The acid catalyzes polymerization. Such acid-generating additives are known to those of ordinary skill in the art, and the specific acid-generating additive used depends on the planarization material and the desired curing conditions. In general, the acid-generating additive is selected to be sensitive to radiation at the first wavelength $\lambda_1$, which, in some implementations, is in the visible or near ultraviolet (near UV) range. For example, in some implementations, the first wavelength $\lambda_1$, is selected to be approximately 400 nanometers (nm) or longer. A phenolic polymer or epoxy resin, such as epoxy novolac 431 (DEN-431) which is commercially available from the Dow Chemical Co., can be used as the planarization material 20. Other phenolic resins, such as hydroxystyrene polymers, also can be used. A suitable acid catalyst is the photoacid-generating additive triphenyl-sulphonium hexafluoroantimonate.

According to a first embodiment, a base-generating additive also is added to the planarization material 20. As explained below, one purpose of adding the base-generating additive is to inhibit curing of the planarization material 20 near the interface with the optical flat 12. The base-generating additive should be sensitive to radiation at a second wavelength $\lambda_2$, yet inert or substantially inert to radiation at the first wavelength $\lambda_1$. Moreover, the second wavelength $\lambda_2$ should be selected so that radiation at the second wavelength is primarily absorbed near the surface of the planarization material 20 at the interface with the optical flat 12 and does not penetrate very far into the planarization material. For example, in some implementations, a base-generating additive that is sensitive to radiation having a wavelength $\lambda_2$ in the deep UV range, in other words, radiation having a wavelength in the range of about 190–280 nm, can be used. Examples of such base-generating additives include bis{[(2,6-dinitrobenzyl) oxy]carbonyl}hexane-1,6-diamine, which are sensitive to radiation at wavelengths of about 254 nm and lower. The penetration depth of such radiation in phenolic polymers such as epoxy novolac 431 is only about 30–50 nm.

According to the first embodiment, a planarization material 20 including an acid-generating photo-agent and a base-generating photo-agent is deposited onto the surface of the wafer 14 which then is placed onto the flexible mat 16. The optical flat 12 is brought into contact with the planarization material 20. The planarization material 20 is then exposed to the radiation at the first wavelength $\lambda_1$ and the second wavelength $\lambda_2$ at substantially the same time. Alternatively, the planarization material 20 can be exposed to the radiation at the second wavelength $\lambda_2$ and subsequently to the radiation at the first wavelength $\lambda_1$.

Figure 5A:
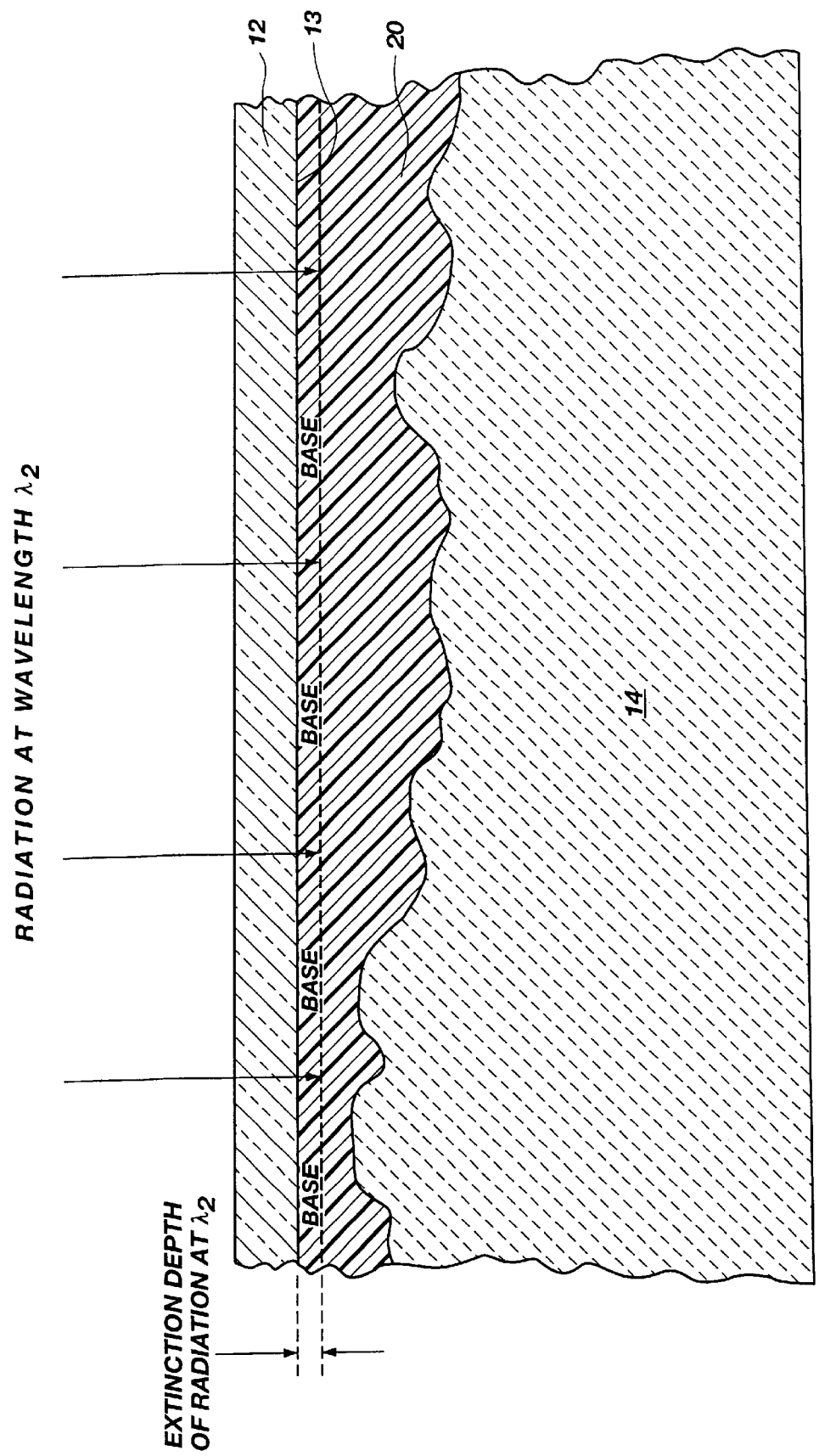
FIGS. 5A through 5C illustrate a technique according to a first embodiment of the invention.
Figure 5B:
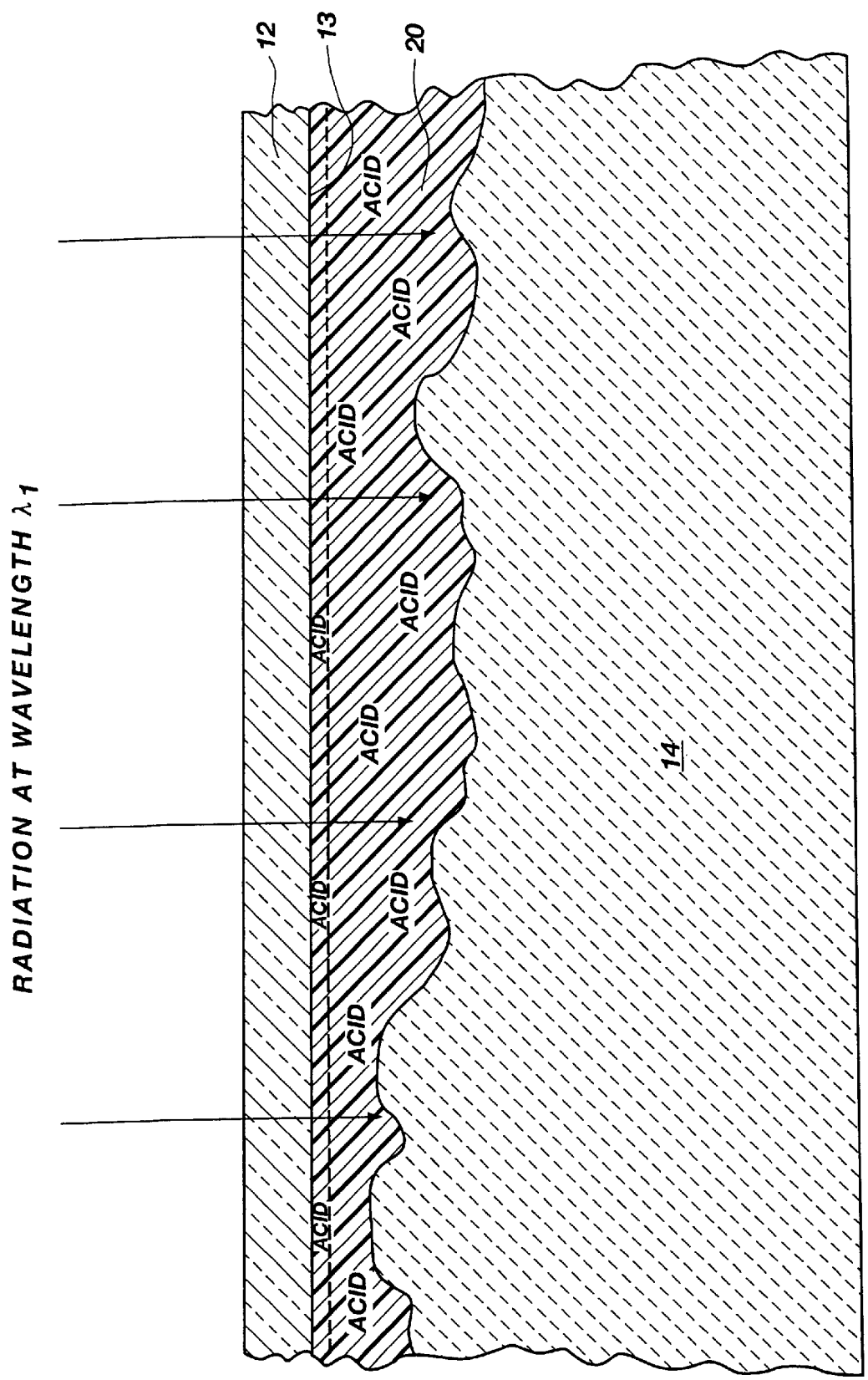
Figure 5C:
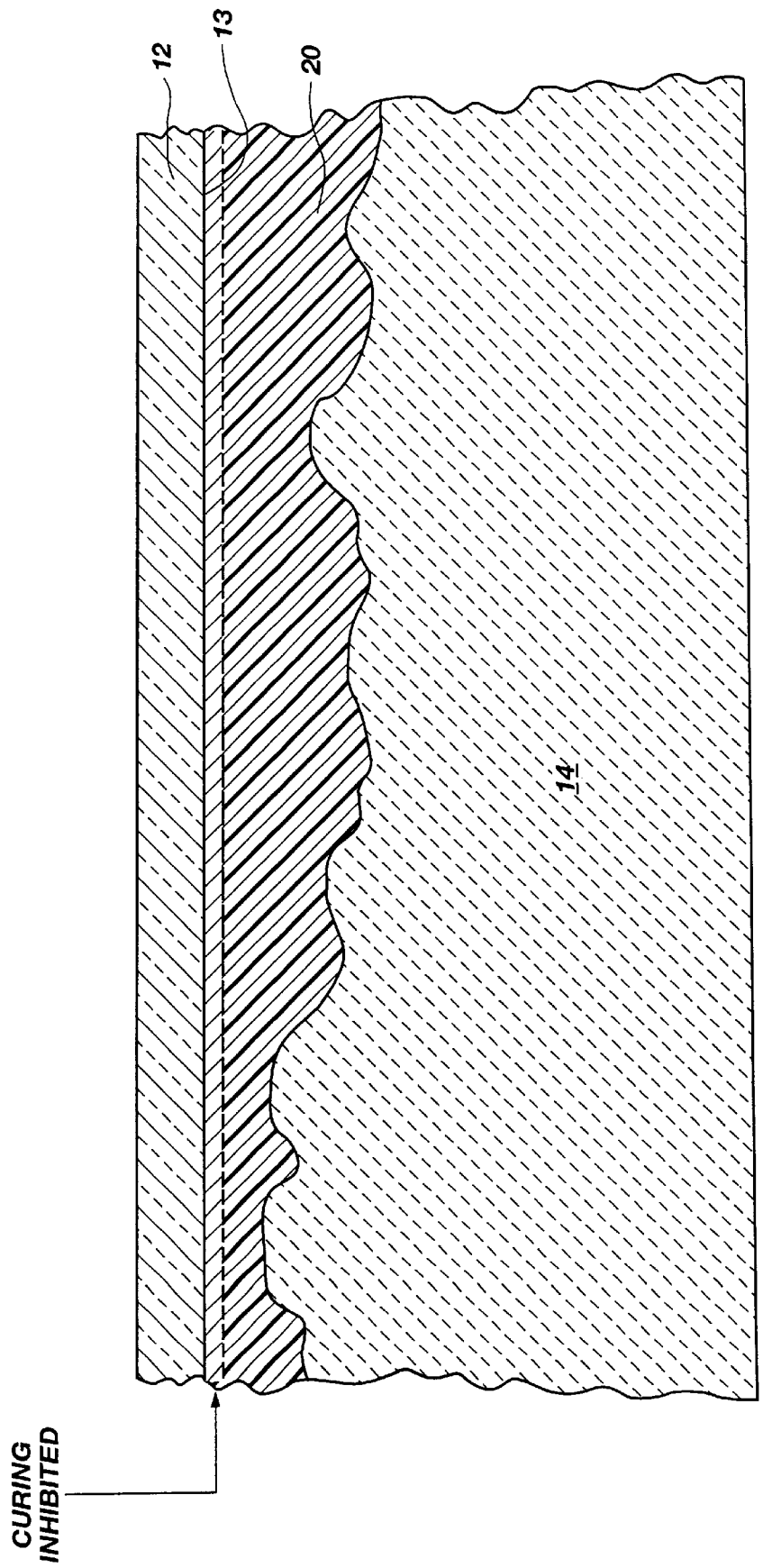

Exposure of the planarization material 20 to radiation at the second wavelength $\lambda_2$ produces an excess of base near the interface with the optical flat 12. The excess base serves to neutralize the acid that is produced by exposure of the planarization material to radiation at the first wavelength $\lambda_1$, thereby inhibiting the acid from curing the planarization material. However, since the radiation at the second wavelength $\lambda_2$ has a shallow penetration depth into the planarization material 20, the base produced by that radiation only inhibits curing of the planarization material at or near the interface with the optical flat 12. The remainder of the planarization material 20 is cured by exposure to the longer wavelength radiation ($\lambda_1$) which penetrates throughout the planarization material. The technique is shown schematically in FIGS. 5A through 5C. Inhibiting curing of the planarization material 20 at or near the interface with the optical flat 12 reduces adhesion between the two surfaces and facilitates separation of the optical flat from the planarization material.

In some implementations, a single source of radiation can be used to provide radiation at the first wavelength $\lambda_1$ and the second wavelength $\lambda_2$. For example, in one implementation, a mercury arc lamp with appropriate filters is used. Alternatively, separate radiation sources can be used. Thus, for example, a deuterium lamp or an excimer laser can be used to provide radiation at the second, shorter wavelength $\lambda_2$.

Figure 6A:
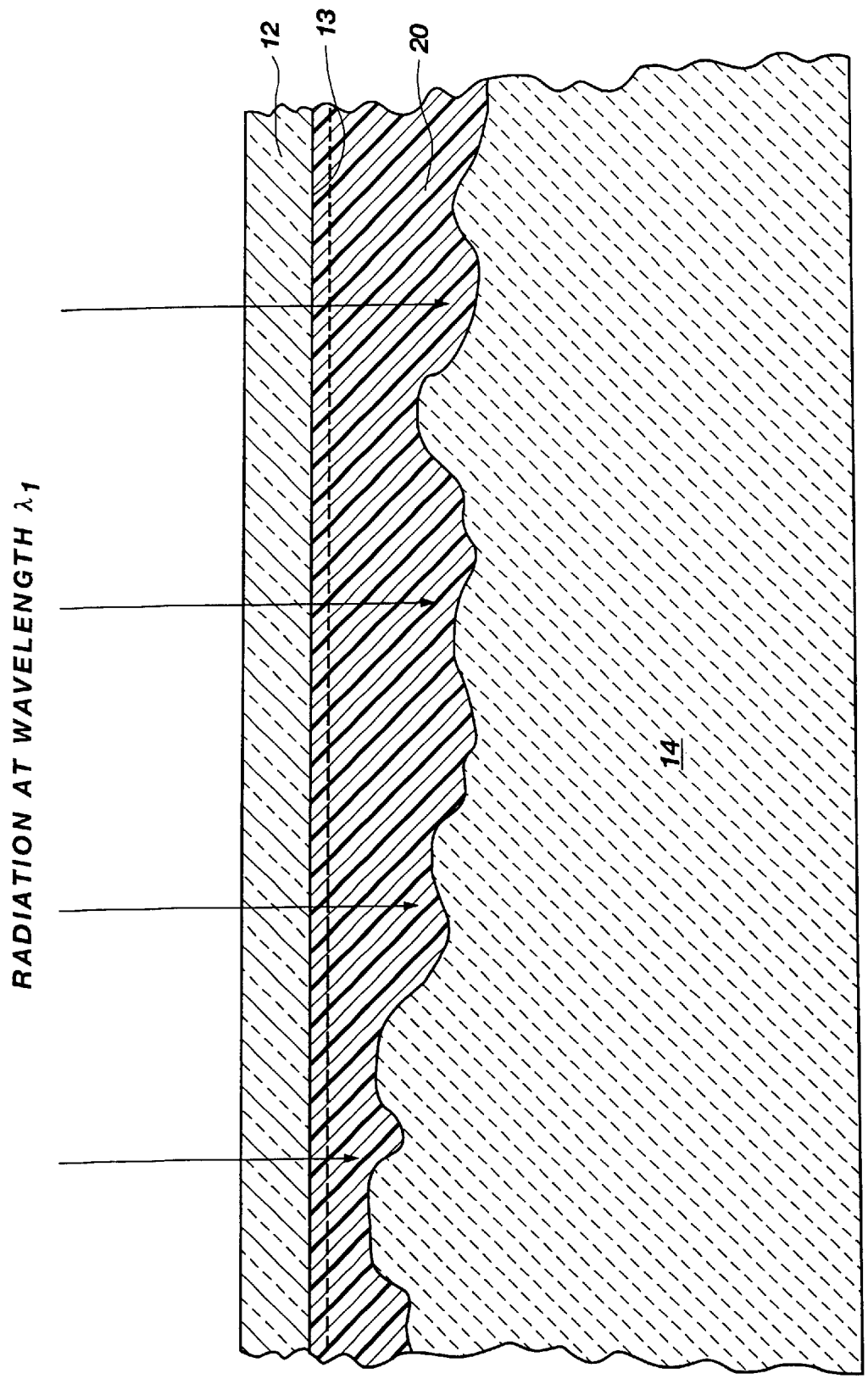
FIGS. 6A and 6B illustrate a technique according to a second embodiment of the invention.
Figure 6B:
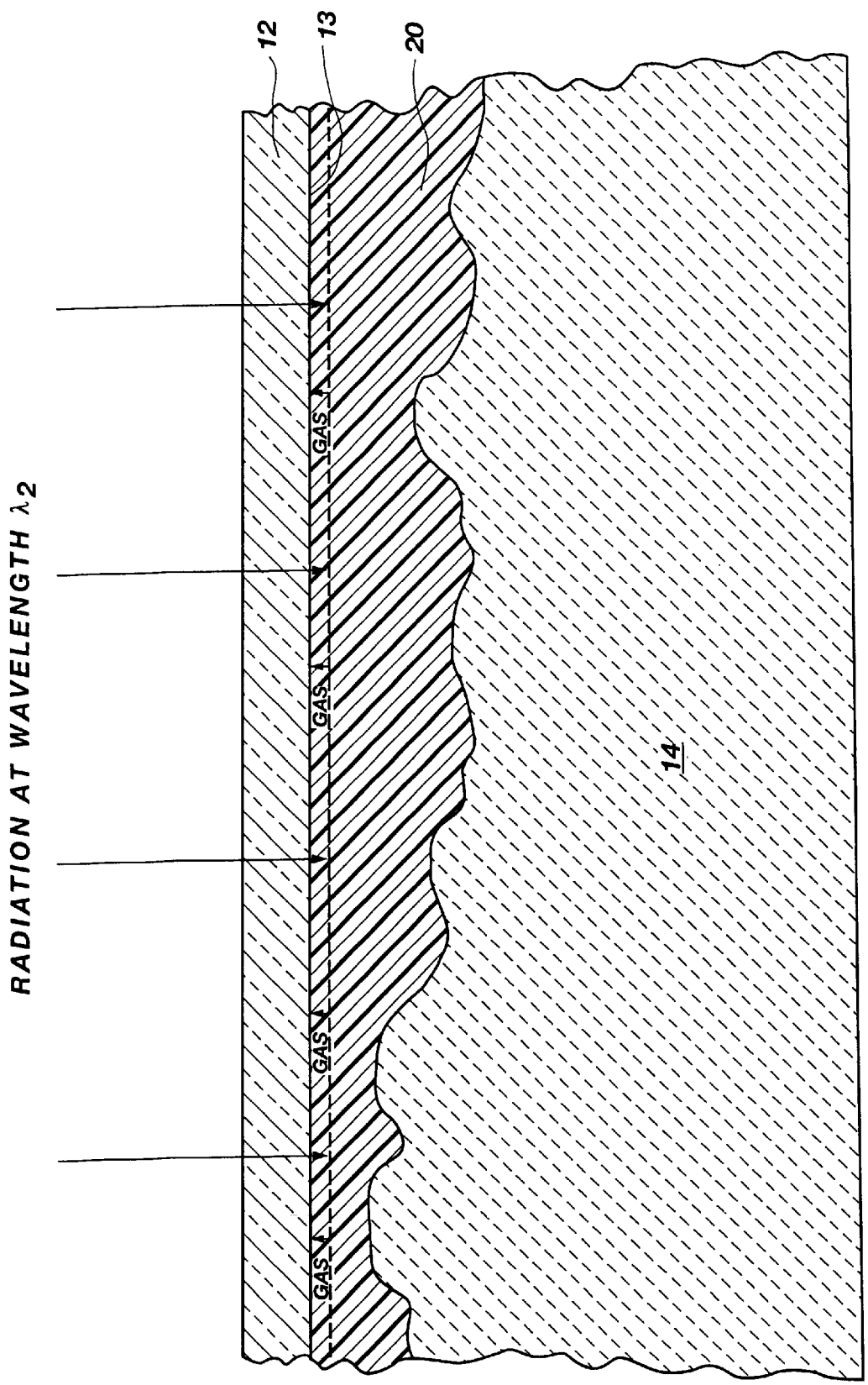

According to a second embodiment, the planarization material 20 can include a photosensitive agent which, when exposed, for example, to deep UV radiation, produces one or more gases such as hydrogen ($H_2$), nitrogen ($N_2$), nitrous oxide ($N_2O$), sulfur tri-oxide ($SO_3$), acetylene ($C_2H_2$), carbon dioxide ($CO_2$), ammonia ($NH_3$) or methane ($CH_4$). Radiation at a first wavelength $\lambda_1$, such as visible or near UV range, can be used to cure the planarization material, and the deep UV radiation ($\lambda_2$) can be used to produce one or more of the foregoing gases (FIGS. 6A and 6B). The generation of the gas(es) produces localized pressure near the interface between the planarization material 20 and the optical flat 12 to facilitate separation of the optical flat from the planarization material.

In one implementation, for example, a carbonate such as $(HOC_2H_4NH_3)_2CO_3$ is added to a phenolic polymer such as epoxy novolac 431. By tuning the deep UV radiation to break the bonds of the carbonate, the carbonate decomposes and produces $CO_2$ as a by-product:

$$(HOC_2H_4NH_3)_2CO_3 \rightarrow CO_2 + H_2O + (HOC_2H_4NH_2).$$

The radiation which causes the carbonate to decompose and release the $CO_2$ gas can be provided either at the same time as the curing radiation or subsequent to the curing radiation.

The technique of the first embodiment, in which curing of the planarization material is inhibited near the interface with the optical flat, and the technique of the second embodiment, in which gaseous by-products are produced to provide localized pressure, can be used together to facilitate separation of the optical flat 12 from the planarization material 20.

According to a third embodiment, a polymer, such as poly a methyl, 3, hydroxy-6-methyl, styrene, is provided with doubly substituted carbon backbone atoms and is used as the planarization material 20. As explained below, one purpose of providing the doubly substituted carbon backbone is to allow the planarization material 20 to decompose near the interface with the optical flat 12 when exposed to radiation at a second wavelength during or following curing. In particular, polymers with a doubly substituted carbon backbone are sensitive to deep UV radiation and react by scission at the substituted carbon atom, rather than crosslinking. Moreover, the deep UV radiation is absorbed near the upper surface of the polymer and does not penetrate deeply into the material. Other functional groups which facilitate the photodecomposition of the polymer also can be used.

Figure 7:
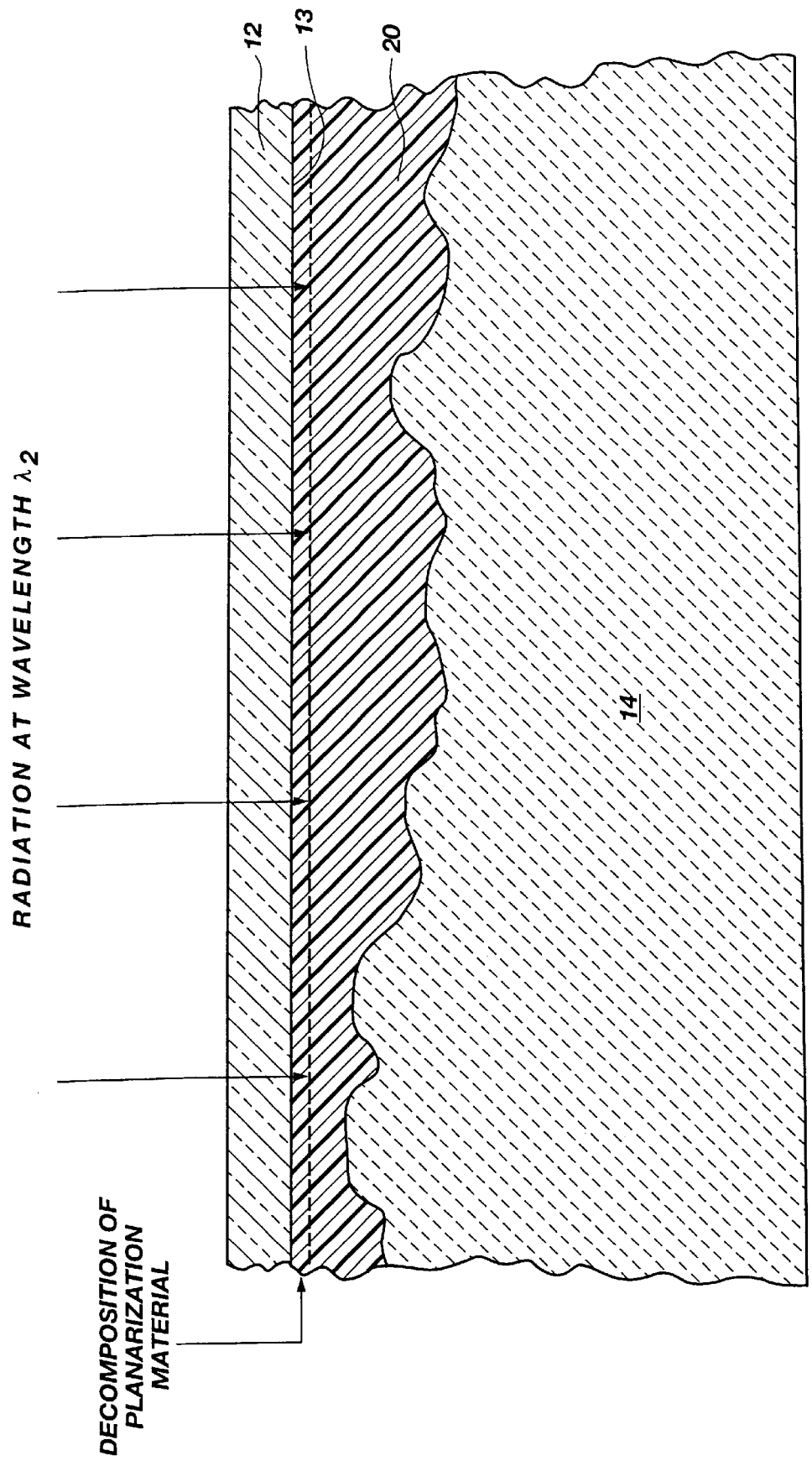
FIG. 7 illustrates a technique according to a third embodiment of the invention.

In the third embodiment, a polymer with a doubly substituted carbon backbone is deposited on the wafer 14 and serves as the planarization material 20. After the optical flat 12 is brought into contact with the planarization material, the planarization material is exposed to radiation at a first wavelength $\lambda_1$, (e.g., greater than 400 nm) and radiation at the second wavelength $\lambda_2$ in the deep UV range. Radiation at the first wavelength serves to cure the planarization material 20. When the planarization material 20 is exposed to the deep UV radiation, scission occurs at the substituted carbon atoms. Since the deep UV radiation does not penetrate deeply into the planarization material 20, the polymer decomposes only near the interface with the optical flat 12 (FIG. 7). The decomposed surface of the planarization material facilitates separation from the optical flat 12.

The techniques of the second and third embodiments can be used together to facilitate separation of the optical flat 12 from the planarization material 20.

Although the invention has been described with respect to transferring a substantially flat or planar surface to surfaces underlying the resist, the techniques described above also can be used to transfer a curved or other non-planar surface to the underlying layers.

Other implementations are within the scope of the following claims.

What is claimed is:

1. A planarizing method for a surface of a wafer, comprising:
   providing a planarization material on said surface of said wafer, said planarization material including an agent sensitive to radiation having a wavelength for inhibiting curing of the planarization material when exposed to the radiation having a wavelength for inhibiting curing;
   providing a substantially flat surface;
   contacting the planarization material on said surface of said wafer using the substantially flat surface;
   providing radiation having a first wavelength;
   exposing the planarization material on said surface of said wafer to the radiation having a first wavelength;
   curing the planarization material on said surface of said wafer using the radiation having a first wavelength;
   providing radiation having a second wavelength, said radiation having a second wavelength for inhibiting curing of said planarization material; and
   exposing the planarization material on said surface of said wafer to the radiation having a second wavelength causing changes to the planarization material for facilitating separation of the substantially flat surface from the planarization material on said surface of said wafer.

2. The method of claim 1 wherein the planarization material includes an phenolic polymer and wherein the radiation having a second wavelength comprises radiation in a deep UV range.

3. The method of claim 1, further comprising:
   absorbing the radiation having a second wavelength by the planarization material of said surface of said wafer within approximately 50 nanometers of an interface between the planarization material on said surface of said wafer and the substantially flat surface.

4. The method of claim 3, wherein contacting the planarization material on said surface of said wafer using the substantially flat surface includes:
   providing an optical flat; and
   contacting the planarization material of said surface of said wafer using said optical flat, the radiation having a first wavelength and the radiation having a second wavelength passing through the optical flat.

5. The method of claim 1, wherein the exposing of the planarization material on said surface of said wafer to the radiation having a first wavelength and the radiation having a second wavelength occurs substantially at the same time.

6. The method of claim 1, wherein exposing the planarization material on said surface of said wafer to the radiation having a second wavelength occurs before exposing the planarization material on said surface of said wafer to the radiation having a first wavelength.

7. The method of claim 1, wherein the planarization material includes a first agent sensitive to radiation having a first wavelength greater than about 400 nanometers and a second agent sensitive to radiation at the second wavelength in the range of about 190 to 280 nanometers for inhibiting curing of the planarization material on said surface of said wafer when exposed to the radiation having a second wavelength.

8. The method of claim 1, wherein the planarization material on said surface of said wafer includes an acid-generating agent sensitive to radiation having a first wavelength and a base-generating agent sensitive to radiation having a second wavelength.

9. The method of claim 8 wherein the first wavelength is longer than the second wavelength.

10. The method of claim 1, including:
providing an optical flat having a substantially flat surface, the optical flat transparent to the radiation having a first wavelength and the radiation having a second wavelength;
contacting the planarization material on said surface of said wafer using the optical flat; and
exposing the planarization material to the radiation having a first wavelength and the radiation having a second wavelength includes passing the radiation having a first wavelength and the radiation having a second wavelength throught the optical flat.

11. The method of claim 1, wherein the planarization material on said surface of said wafer includes an agent sensitive to the radiation at the second wavelength for causing the planarization material on said surface of said wafer to decompose when exposed to the radiation having a second wavelength.

12. The method of claim 11, wherein the planarization material on said surface of said wafer includes a polymer having a doubly substituted carbon backbone.

13. The method of claim 11, wherein the exposing the planarization material to the radiation having a first wavelength and the radiation having a second wavelength occurs at substantially at the same time.

14. The method of claim 11, wherein exposing the planarization material said surface of said wafer to the radiation having a first wavelength occurs prior to exposing the planarization material on said surface of said wafer to the radiation having a second wavelength.

15. The method of claim 14, wherein the radiation having a second wavelength comprises radiation in a deep UV range.

16. The method of claim 1, wherein the planarization material on said surface of said wafer produces a gaseous by-product when exposed to the radiation having a second wavelength.

17. The method of claim 16, wherein the planarization material on said surface of said wafer includes a carbonate which produces the gaseous by-product when exposed to the radiation having a second wavelength.

18. The method of claim 16, wherein the gaseous by-product is selected from a group consisting of hydrogen ($H_2$), nitrous oxide ($N_2O$), sulfur tri-oxide ($SO_3$), acetylene ($C_2H_2$), carbon dioxide ($CO_2$), ammonia ($NH_3$) and methane ($CH_4$).

19. The method of claim 16, wherein the gaseous by-product produces localized gas pressure at an interface between the planarization material on said surface of said wafer and the substantially flat surface.

20. The method of claim 1, further including:
separating the substantially flat surface from the planarization material on said surface of said wafer.

21. A planarization method for a surface of a wafer, the method comprising:
providing a planarization material on the surface of said wafer, the planarization material including a first acid-generating agent sensitive to radiation having a first wavelength and a second base-generating agent sensitive to radiation having a second wavelength, the planarization material cured in the presence of acid;
providing a substantially flat surface;
bring the substantially flat surface into contact with the planarization material on the surface of said wafer;
exposing the planarization material to the radiation having the second wavelength to produce base near an interface between the planarization material and the substantially flat surface; and
exposing the planarization material to the radiation having the first wavelength to produce acid using the first acid-generating agent in the planarization material.

22. The method of claim 21, further comprising:
absorbing the radiation having a second wavelength by the planarization material of said surface of said wafer within approximately 50 nanometers of an interface between the planarization material on said surface of said wafer and the substantially flat surface.

23. The method of claim 22, further comprising:
neutralizing the acid using base neutralizers for inhibiting curing of the planarization material near the interface between the planarization material and the substantially flat surface.

24. The method of claim 21, further including:
separating the substantially flat surface from the planarization material.

* * * * *

UNITED STATES PATENT AND TRADEMARK OFFICE
CERTIFICATE OF CORRECTION

PATENT NO. : 6,403,499 B2
DATED : June 11, 2002
INVENTOR(S) : Eugene P. Marsh

It is certified that error appears in the above-identified patent and that said Letters Patent is hereby corrected as shown below:

Column 5,
Line 48, before "methyl" change "a" to -- α --

Column 6,
Line 2, change "an" to -- a --
Line 10, make the sentence starting "The techniques" a new paragraph.

Column 8,
Line 13, after "produce" and before "base" insert -- a --

Signed and Sealed this

Twenty-eighth Day of June, 2005

JON W. DUDAS
*Director of the United States Patent and Trademark Office*